(12) United States Patent
Cho et al.

(10) Patent No.: US 9,773,858 B2
(45) Date of Patent: Sep. 26, 2017

(54) ORGANIC LIGHT-EMITTING DIODE DISPLAY

(71) Applicant: Samsung Display Co., Ltd., Yongin, Gyeonggi-Do (KR)

(72) Inventors: Se Hyoung Cho, Hwaseong-si (KR); Kyung-Hoon Kim, Uiwang-si (KR); Gyung Soon Park, Seoul (KR); Min Jae Jeong, Suwon-si (KR); Il Gon Kim, Seoul (KR); Mee Hye Jung, Suwon-si (KR)

(73) Assignee: Samsung Display Co., Ltd., Yongin-si, Gyeonggi-do (KR)

( * ) Notice: Subject to any disclaimer, the term of this patent is extended or adjusted under 35 U.S.C. 154(b) by 36 days.

(21) Appl. No.: 14/731,124

(22) Filed: Jun. 4, 2015

(65) Prior Publication Data
US 2016/0181349 A1    Jun. 23, 2016

(30) Foreign Application Priority Data
Dec. 19, 2014    (KR) .......................... 10-2014-0184655

(51) Int. Cl.
H01L 27/32    (2006.01)

(52) U.S. Cl.
CPC ...... *H01L 27/3279* (2013.01); *H01L 27/3223* (2013.01)

(58) Field of Classification Search
CPC ... G09G 2300/0426; G09G 2300/0809; G09G 3/20
See application file for complete search history.

(56) References Cited

U.S. PATENT DOCUMENTS

| 2006/0123293 A1* | 6/2006 | Kim ...................... G09G 3/3291 |
| | | 714/724 |
| 2012/0013597 A1 | 1/2012 | Han |
| 2014/0176399 A1* | 6/2014 | Lee .......................... G09G 3/20 |
| | | 345/55 |

FOREIGN PATENT DOCUMENTS

| JP | 2008-003591 A | 1/2008 |
| KR | 10-1249246 B1 | 3/2013 |

* cited by examiner

*Primary Examiner* — William F Kraig
*Assistant Examiner* — Khatib Rahman
(74) *Attorney, Agent, or Firm* — Knobbe, Martens, Olson & Bear LLP

(57) ABSTRACT

An organic light-emitting diode display is disclosed. In one aspect, the display includes a plurality of data lines formed in a display area and a plurality of data pad portions formed in a non-display area and including a plurality of data pads and a plurality of dummy pads formed outside of the data pads. The display also includes a plurality of data fan-out portions electrically connected to the data pads and the data lines, and including a plurality of diagonal portions diagonally formed with respect to the data lines. The display also includes a plurality of voltage applying lines electrically connected to the dummy pads and insulated from the data fan-out portions, wherein at least one of the voltage applying lines intersects one or more of the diagonal portions.

20 Claims, 22 Drawing Sheets

ORGANIC LIGHT-EMITTING DIODE DISPLAY

INCORPORATION BY REFERENCE TO ANY PRIORITY APPLICATIONS

This application claims priority to and the benefit of Korean Patent Application No. 10-2014-0184655 filed in the Korean Intellectual Property Office on Dec. 19, 2014, the entire contents of which are incorporated herein by reference.

BACKGROUND

Field

The described technology generally relates to an organic light-emitting diode display.

Description of the Related Technology

The display area of an organic light-emitting diode (OLED) display is provisioned with a plurality of signal lines and a plurality of pixels which are connected to the signal lines. The signal lines include scan lines through which scan signals are transferred, data lines through which data signals are transferred, and driving voltage lines through which a driving voltage (ELVDD) is transferred.

The scan lines and the data lines are connected to scan driving circuits and data driving circuits, respectively, which are formed in a non-display area surrounding the display area to receive the scan signals and the data signals, respectively. A plurality of data pad parts which are electrically connected to output terminals of the data driving circuits are arranged in the non-display area in a row direction and each data pad part has data fan-out parts to connect the data pad parts to the data lines.

Outermost sides of each data pad part has dummy pads which transfer voltage signals. Further, a plurality of voltage applying lines are connected to the dummy pads to transfer the driving voltage (ELVDD) to the driving voltage lines which are formed in the display area or a common voltage (ELVSS) to a common electrode which is formed in the display area.

The above information disclosed in this Background section is only for enhancement of understanding of the background of the described technology and therefore it may contain information that does not form the prior art that is already known in this country to a person of ordinary skill in the art.

SUMMARY OF CERTAIN INVENTIVE ASPECTS

One inventive aspect is an OLED display that can improve uniformity of a screen by reducing a deviation in wiring resistance for a plurality of voltage applying lines.

Another aspect is an OLED display including a data line, a data pad part, a data fan-out part, and a plurality of voltage applying lines. The data line can be formed in a display area. The data pad part can be formed in a non-display area and formed outside a plurality of data pads and a plurality of dummy pads formed outside the plurality of data pads. The data fan-out part can connect a plurality of data pads to a plurality of data lines and can include a diagonal part. The plurality of voltage applying lines can be connected to a plurality of dummy pads and can be insulated from the data fan-out part and the at least one voltage applying line can intersect the diagonal part.

The OLED display can further include a driving voltage line and a voltage wiring. The driving voltage line can be formed in a display area. The voltage wirings can be connected to the plurality of voltage applying lines and the plurality of driving voltage lines and cross the data fan-out parts in a state in which the voltage wirings are insulated from the data fan-out parts.

The data pad part and the data fan-out part can each be provided in plural along a first direction. The rest voltage applying lines other than two voltage applying lines, which are positioned at outermost sides, among the plurality of voltage applying lines connected to the plurality of data pad parts can intersect the diagonal parts of the data fan-out parts.

The voltage wirings can include a plurality of connection points contacting the plurality of voltage applying lines, and All distances between the plurality of connection points can be equal. At least two of all distances between the plurality of connection points can be different and a maximum distance between the plurality of connection points can be twice or less of a minimum distance between the plurality of connection points.

The data pad part and the data fan-out part can each be provided in plural along a first direction. The plurality of dummy pads in each of the plurality of data pad parts can be formed outside the plurality of data pads and at a center of the plurality of data pads. The plurality of voltage applying lines can be connected to each of the plurality of dummy pads.

The rest voltage applying lines other than two voltage applying lines which are positioned at outermost sides and one voltage applying line which is positioned at a center among the plurality of voltage applying lines connected to the plurality of data pad parts can intersect the diagonal parts of the data fan-out parts.

The voltage wirings can include a plurality of connection points contacting the plurality of voltage applying lines. All distances between the plurality of connection points can be equal. At least two of all distances between the plurality of connection points can be different and a maximum distance between the plurality of connection points can be twice or less of a minimum distance between the plurality of connection points.

The OLED display can further include a common electrode which is formed on the display area and the data fan-out part. The plurality of voltage applying lines can be connected to the common electrode.

The plurality of voltage applying lines can be formed on the first insulating layer covering the data fan-out part and the common electrode can be formed on the second insulating layer covering the plurality of voltage applying lines. The second insulating layer can form via holes at ends of each of the plurality of voltage applying lines.

The data pad part and the data fan-out part can each be provided in plural along a first direction. The rest voltage applying lines other than two voltage applying lines, which are positioned at outermost sides, among the plurality of voltage applying lines connected to the plurality of data pad parts can intersect the diagonal parts of the data fan-out parts.

The common electrode can include the plurality of connection points contacting the plurality of voltage applying lines. All distances between the plurality of connection points can be equal. At least two of all distances between the plurality of connection points can be different and a maximum distance between the plurality of connection points can be twice or less of a minimum distance between the plurality of connection points.

Another aspect is an organic light-emitting diode (OLED) display, comprising: a plurality of data lines formed in a display area; a plurality of data pad portions formed in a non-display area and including a plurality of data pads and a plurality of dummy pads formed outside of the data pads; a plurality of data fan-out portions electrically connected to the data pads and the data lines, and including a plurality of diagonal portions diagonally formed with respect to the data lines; and a plurality of voltage applying lines electrically connected to the dummy pads and insulated from the data fan-out portions, wherein at least one of the voltage applying lines intersects one or more of the diagonal portions.

The above OLED display further comprises: a plurality of driving voltage lines formed in the display area; and a plurality of voltage wirings electrically connected to the voltage applying lines and the driving voltage lines and crossing the data fan-out portions such that the voltage wirings are insulated from the data fan-out portions.

In the above OLED display, the voltage applying lines, excluding two outermost voltage applying lines, intersect one or more of the diagonal portions.

In the above OLED display, the voltage wirings include a plurality of connection points contacting the voltage applying lines, wherein all distances between neighboring connection points are substantially equal.

In the above OLED display, the voltage wirings include a plurality of connection points contacting the voltage applying lines, wherein at least two of the distances between neighboring connection points are different from each other, and wherein the maximum distance between any of the neighboring connection points is less than or equal to twice as long as the minimum distance between any of the other neighboring connection points.

In the above OLED display, the dummy pads are formed outside of the data pads and position at a substantially center of the data pads, wherein the voltage applying lines are electrically connected to each of the dummy pads, respectively.

In the above OLED display, the voltage applying lines, excluding two outermost voltage applying lines and one voltage applying line positioned at a center, intersect one or more of the diagonal portions.

In the above OLED display, the voltage wirings include a plurality of connection points contacting the voltage applying lines, wherein all distances between neighboring connection points are substantially equal.

In the above OLED display, the voltage wirings include a plurality of connection points contacting the voltage applying lines, wherein at least two of the distances between neighboring connection points are different from each other, and wherein the maximum distance between any of the neighboring connection points is less than or equal to about twice as long as the minimum distance between any of the other neighboring connection points.

The above OLED display further comprises a common electrode formed in the display area, wherein the voltage applying lines are electrically connected to the common electrode.

In the above OLED display, the voltage applying lines are formed over a first insulating layer at least partially covering the data fan-out portions, wherein the common electrode is formed over a second insulating layer at least partially covering the voltage applying lines, and wherein the second insulating layer has via holes formed therein at each end of the voltage applying lines.

In the above OLED display, the voltage applying lines, excluding two outermost voltage applying lines, intersect one or more of the diagonal portions.

In the above OLED display, the common electrode includes a plurality of connection points contacting the voltage applying lines, wherein all distances between neighboring connection points are substantially equal.

In the above OLED display, the common electrode includes a plurality of connection points contacting the voltage applying lines, wherein at least two of the distances between neighboring connection points are different from each other, and wherein the maximum distance between any of the neighboring connection points is less than or equal to about twice as long as the minimum distance between the any of the other neighboring connection points.

Another aspect is an organic light-emitting diode (OLED) display, comprising: a plurality of data lines formed in a display area; a plurality of voltage wirings formed in a non-display area; a plurality of data pad portions formed in the non-display area and including i) a plurality of data pads extending in a first direction and including leftmost and rightmost data pads respectively located in the leftmost and rightmost regions of the data pad portions and ii) a plurality of dummy pads placed in the left of the leftmost data pad and the right of the rightmost data pad; a plurality of data fan-out portions electrically connected to the data pads and the data lines, and including a plurality of first portions and a plurality of second portions formed slanted with respect to the first portions; and a plurality of voltage applying lines electrically connected to the dummy pads and insulated from the data fan-out portions, wherein at least one of the voltage applying lines intersects one or more of the second portions of the data fan-out portions.

In the above OLED display, the voltage applying lines, excluding two outermost voltage applying lines, intersect one or more of the second portions of the data fan-out portions.

In the above OLED display, the voltage wirings include a plurality of connection points contacting the voltage applying lines, wherein all distances between neighboring connection points are substantially equal.

In the above OLED display, the voltage wirings include a plurality of connection points contacting the voltage applying lines, wherein at least two of the distances between neighboring connection points are different from each other, and wherein the maximum distance between any of the neighboring connection points is less than or equal to twice as long as the minimum distance between any of the other neighboring connection points.

In the above OLED display, the dummy pads are formed outside of the data pads and positioned at a substantially center of the data pads, wherein the voltage applying lines are electrically connected to each of the dummy pads, respectively.

In the above OLED display, the voltage applying lines, excluding two outermost voltage applying lines and one voltage applying line positioned at a center, intersect one or more of the second portions of the data fan-out portions, wherein the voltage wirings include a plurality of connection points contacting the voltage applying lines, and wherein all distances between neighboring connection points are substantially equal.

According to at least one of the disclosed embodiments, it is possible to remove or greatly reduce the deviation in the interval between the connection points for the voltage wirings. Therefore, it is possible to reduce the deviation in the wiring resistance between the driving voltage lines at a close portion to the connection point and the driving voltage lines at a far portion from the connection point, among the plurality of driving voltage lines which are connected to the voltage wirings and improve the uniformity (left and right uniformity) depending on the row direction of the screen.

DETAILED DESCRIPTION OF CERTAIN INVENTIVE EMBODIMENTS

Figure 1:
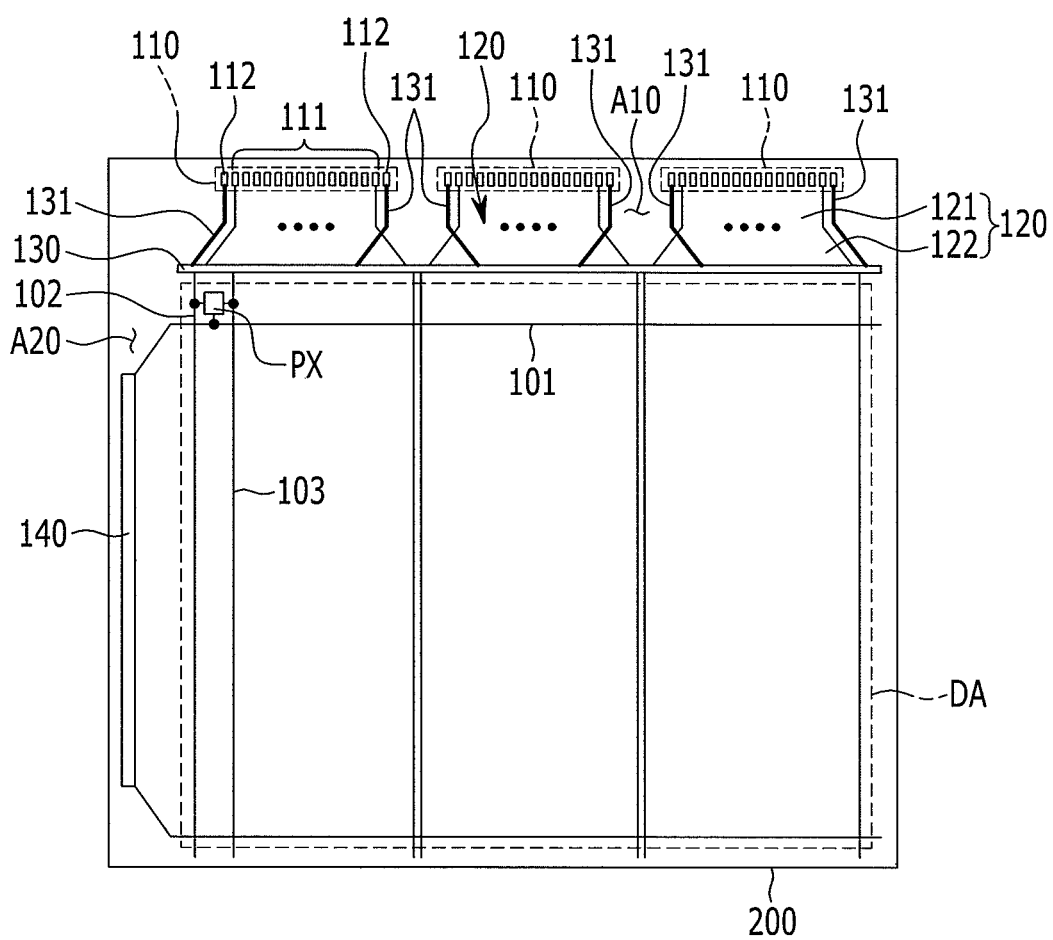
FIG. 1 is a schematic diagram of an OLED display according to a first exemplary embodiment.

Hereinafter, the present disclosure will be described more fully hereinafter with reference to the accompanying drawings, in which exemplary embodiments of the disclosure are shown. As those skilled in the art would realize, the described embodiments can be modified in various different ways, all without departing from the spirit or scope of the present disclosure.

Throughout the present specification, it will be understood that when an element such as a layer, a film, a region, or a substrate is referred to as being "on" another element, it can be directly on another element or can have an intervening element present therebetween. Further, "~on" means that an element is over or under an object portion and does not mean that an element is necessarily positioned over an upper portion based on a gravity direction.

Throughout the present specification, unless explicitly described to the contrary, "comprising" any components will be understood to imply the inclusion of other elements. A size, a thickness, etc., of each component illustrated in the drawings are arbitrarily illustrated for convenience of explanation and therefore the present disclosure is not just limited thereto. In this disclosure, the term "substantially" includes the meanings of completely, almost completely or to any significant degree under some applications and in accordance with those skilled in the art. Moreover, "formed on" can also mean "formed over." The term "connected" can include an electrical connection.

Figure 2:
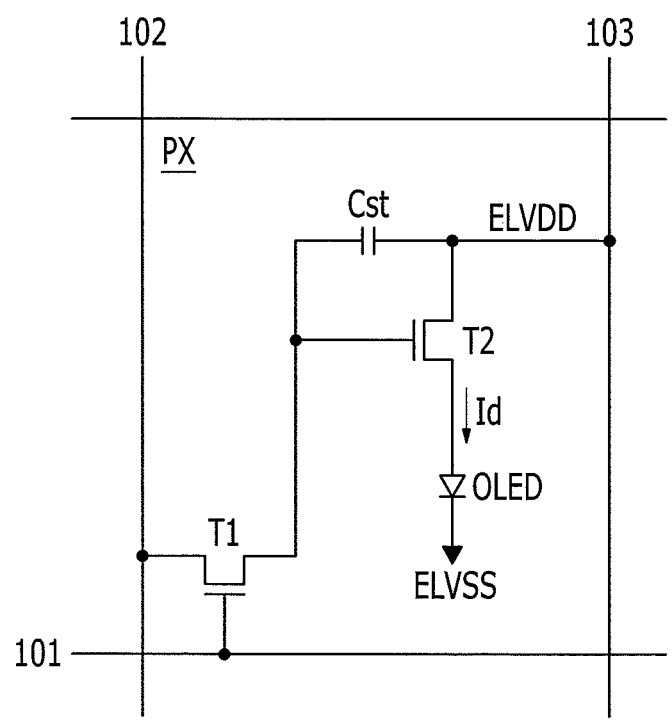
FIG. 2 is an equivalent circuit diagram of a pixel illustrated in FIG. 1.

FIG. 1 is a schematic diagram of an OLED display according to a first exemplary embodiment. FIG. 2 is an equivalent circuit diagram of a pixel illustrated in FIG. 1.

Referring to FIGS. 1 and 2, an OLED display according to a first exemplary embodiment includes a display area (DA) and a non-display area outside the display area (DA). The display area (DA) includes a plurality of signal lines and a plurality of pixels (PXs) which are connected to the signal lines and are arranged approximately in a matrix form.

The signal lines include scan lines 101 through which scan signals are transferred, data lines 102 through which data signals are transferred, and driving voltage lines 103 through which a driving voltage (ELVDD) is transferred. The scan line 101 is formed in a row direction and the data line 102 and the driving voltage line 103 are formed in a column direction crossing the row direction. Each pixel PX includes a switching thin film transistor T1, a driving thin film transistor T2, a storage capacitor Cst, and an organic light-emitting diode (OLED).

The switching thin film transistor T1 includes a control terminal, an input terminal, and an output terminal. The control terminal is connected to the scan line 101, the input terminal is connected to the data line 102, and the output terminal is connected to the driving thin film transistor T2. The switching thin film transistor T1 transfers the data signal applied to the data line 102 to the driving thin film transistor T2 in response to the scan signal applied to the scan line 101.

The driving thin film transistor T2 also includes a control terminal, an input terminal, and an output terminal. The control terminal is connected to the switching thin film transistor T1, the input terminal is connected to the driving voltage line 103, and the output terminal is connected to the OLED. The driving thin film transistor T2 transfers an output current Id of which a magnitude varies depending on a voltage applied between the control terminal and the output terminal.

The storage capacitor Cst is connected between the control terminal and the input terminal of the driving thin film transistor T2. The storage capacitor Cst charges the data signal applied to the control terminal of the driving thin film transistor T2 and maintains the charged data signal even after the switching thin film transistor T1 is turned off.

The OLED includes a pixel electrode connected to the output terminal of the driving thin film transistor T2, a common electrode connected to a common voltage (ELVSS), and an organic emission layer positioned between the pixel electrode and the common electrode. The OLED emits light of which the intensity varies depending on the output current Id of the driving thin film transistor T2.

A pixel configuration of the OLED display is not limited to the foregoing example, and a separate thin film transistor and a separate capacitor can be added thereto.

The non-display area can include a first region A10 and a second region A20. The first region A10 is provided with data pad parts or data pad portions 110 which are electrically connected to output terminals of a data driving circuit (not illustrated). The data driving circuit can be mounted in a separate semiconductor chip package such as a chip on film or can be directly mounted on the first region A10.

The data pad part 110 includes a plurality of data pads 111 and at least two dummy pads 112. The at least two dummy pads 112 are formed outside the data pads 111. That is, the at least two dummy pads 112 are formed at an outermost side of the data pad part 110.

Data fan-out parts or data fan-out portions 120 which connect the data pads 111 to the data lines 102 are formed therebetween. The data fan-out part 120 serves to transfer the data signal output from the data driving circuit (not illustrated) to the data lines 102. The data fan-out part 120 can include straight parts or straight portions 121 which contact the data pads 111 and are formed in substantially a straight line and diagonal parts or diagonal portions 122 which contact the data lines 102 and are formed in a diagonal line.

In the first region A10, the data pad part 110 and the data fan-out part 120 are provided in plurality. That is, the data pad parts 110 and the data fan-out parts 120 are arranged in the row direction. Further, voltage wirings 130 are formed over the data fan-out parts 120, crossing the data fan-out parts 120. The voltage wiring 130 is a single wiring and is formed in parallel with the row direction and is connected to the driving voltage lines 103.

A voltage applying line 131 is formed between dummy pads 112, which are provided in each data pad part 110, and the voltage wiring 130 to connect therebetween. The voltage wiring 130 and the voltage applying line 131 are insulated from the data fan-out parts 120 by the insulating layer (not illustrated). The voltage applying line 131 serves to transfer a driving voltage (ELVDD) signal output from the data driving circuit to the voltage wiring 130 and the driving voltage lines 103.

FIG. 1 illustrates, for example, a case in which three data pad parts 110 and three data fan-out parts 120 are formed in a first region A10 and each data pad part 110 includes the two dummy pads 112. However, the number of data pad parts 110, data fan-out parts 120, and dummy pads 112 is not limited to the illustrated example and therefore can be formed in a greater number than the number illustrated.

The second region A20 is provided with scan pad parts 140 which are electrically connected to output terminals of a scan driving circuit (not illustrated). The scan driving circuit can be mounted on the separate semiconductor chip package such as the chip on film or can be directly mounted on the second region A20. The scan lines 101 extend to the scan pad parts 140 to be connected to the scan pad parts 140 and are applied with the scan signals output from the scan driving circuit.

FIG. 1 illustrates, for example, a case in which the scan pad parts 140 are formed in the second region A20 which contacts a left side of the display area (DA) but the scan pad parts 140 can be formed in the first region A10. On the other hand, the non-display area can further include a third region which contacts a right side of the display area (DA) and the scan pad parts 140 can be formed in both the second region A20 and the third region.

Figure 3A:
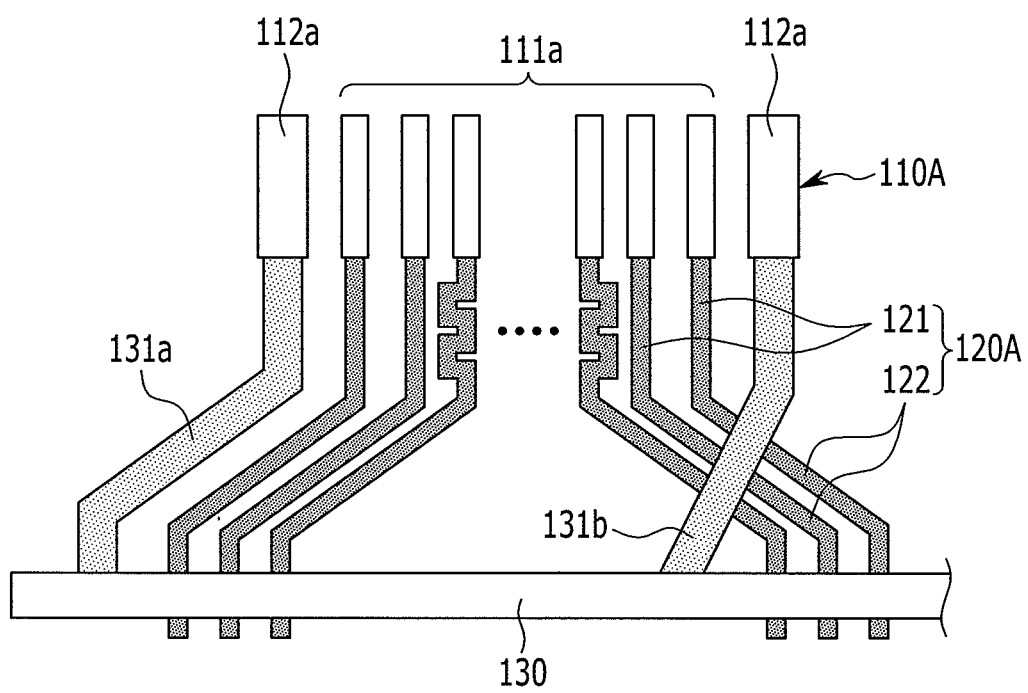
FIGS. 3A to 3C are partially enlarged views of the OLED display illustrated in FIG. 1.
Figure 3B:
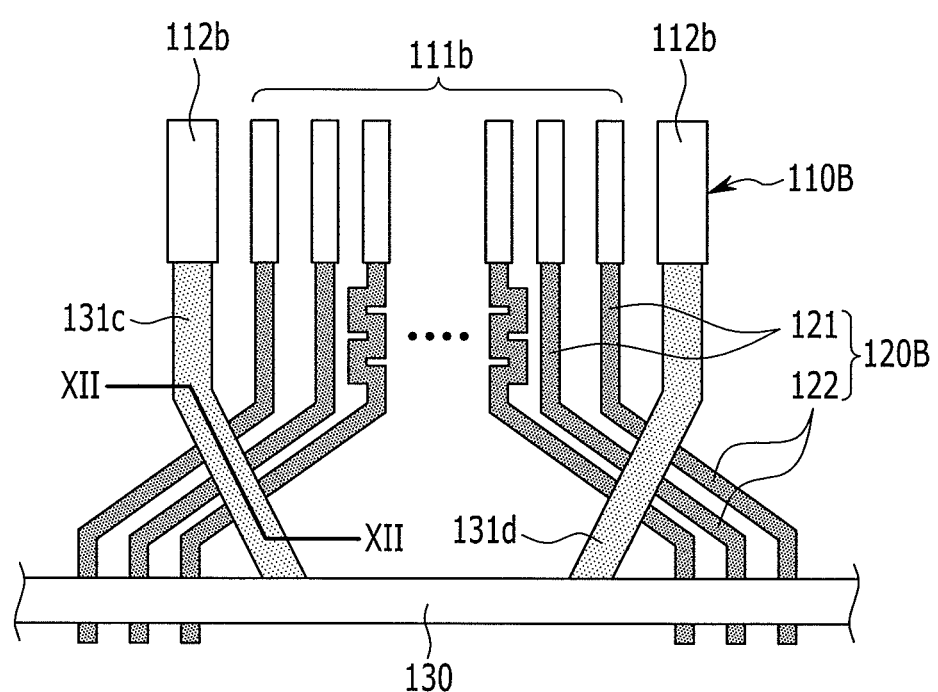
Figure 3C:
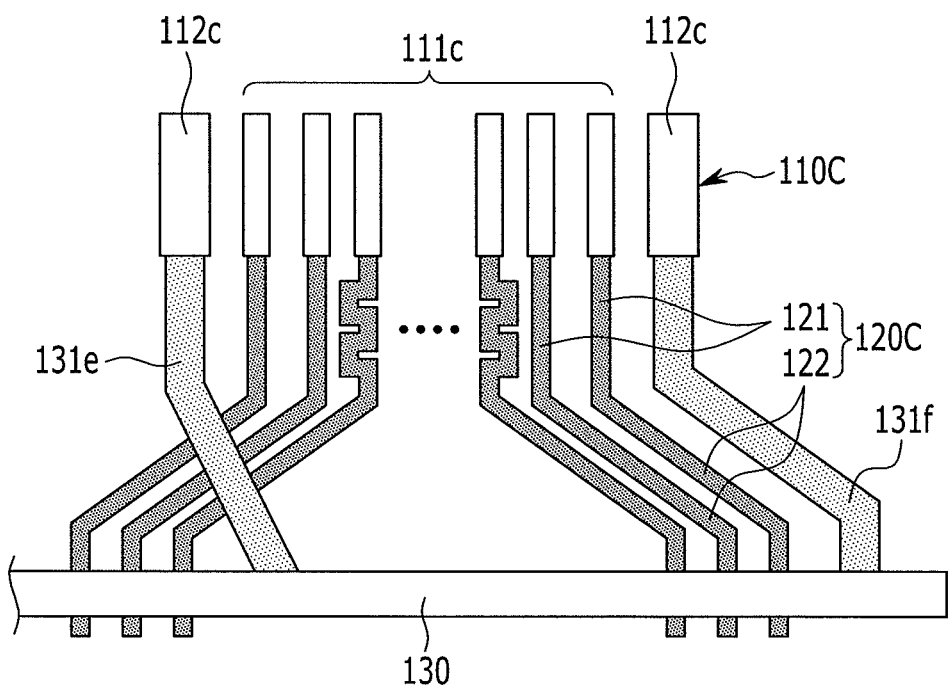

FIGS. 3A to 3C are partially enlarged views of the OLED display illustrated in FIG. 1. A left data pad part or left data pad portion, a central data pad part or central data pad portion, and a right data pad part or right data pad portion among three data pad parts illustrated in FIG. 1 are each illustrated in FIGS. 3A to 3C.

Referring to FIG. 3A, a left data pad part 110A includes a plurality of data pads 111a which are positioned at a center and two dummy pads 112a which are positioned at the outermost sides. The dummy pad 112a to which a voltage signal is applied can be formed to be larger than the data pad 111a.

A data fan-out part 120A includes the straight parts 121 which contact the data pads 111a and the diagonal parts 122 which are diagonally spread. Some of the wirings configuring the straight parts 121 can be formed to have a meandering shape to uniformly meet line resistances of other wirings.

Two voltage applying lines 131a and 131b connect the two dummy pads 112a to the voltage wiring 130. Any one of the two voltage applying lines 131a and 131b can be formed substantially in parallel with the data fan-out part 120A and the other thereof can intersect the data fan-out part 120A.

For example, the voltage applying line 131a (left voltage applying line) which is far away from the central data pad part 110B is formed substantially in parallel with the data fan-out part 120A. On the other hand, the voltage applying line 131b (right voltage applying line) which is close to the data pad part 110B intersects the data fan-out part 120A.

Referring to FIG. 3B, the central data pad part 110B includes a plurality of data pads 111b which are positioned at a center and two dummy pads 112b which are positioned at the outermost sides. Two voltage applying lines 131c and 131d connect the two dummy pads 112b to the voltage wiring 130. The two voltage applying lines 131c and 131d both can intersect the data fan-out part 120B.

Referring to FIG. 3C, the right data pad part 110C includes a plurality of data pads 111c which are positioned at a center and two dummy pads 112c which are positioned at the outermost sides. Two voltage applying lines 131e and 131f connect the two dummy pads 112c to the voltage wiring 130. Any one of the two voltage applying lines 131e and 131f can intersect a data fan-out part 120C and the other thereof can be formed substantially in parallel with the data fan-out part 120C.

For example, the voltage applying line 131e (left voltage applying line), which is close to the central data pad part 110B, intersects the data fan-out part 120C. On the other hand, the voltage applying line 131f (right voltage applying line) which is far away from the central data pad part 110B is formed substantially in parallel with the data fan-out part 120C.

Figure 4:
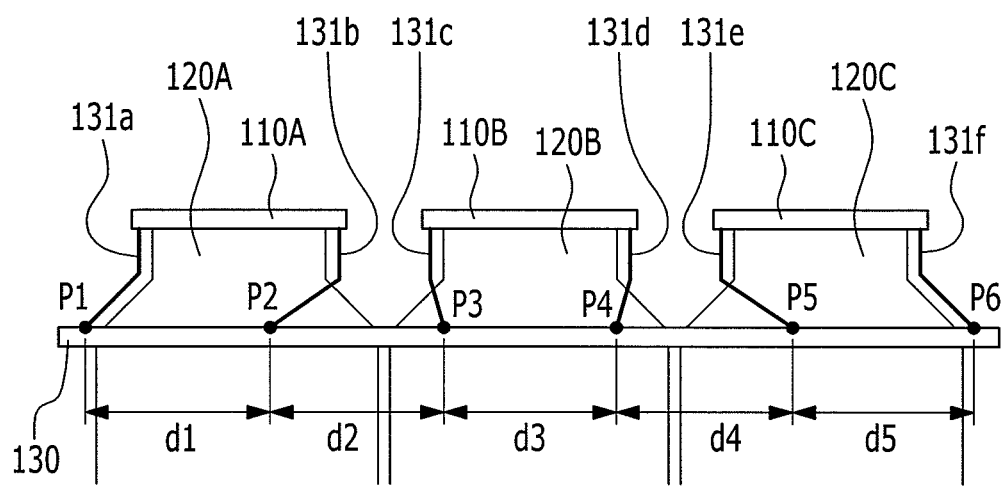
FIG. 4 is a schematic diagram illustrating some components of the OLED display illustrated in FIG. 1.

FIG. 4 is a schematic diagram illustrating some components of the OLED display illustrated in FIG. 1.

Referring to FIG. 4, four voltage applying lines 131b to 131e other than the two voltage applying lines 131a and 131f which are positioned at the outermost sides among the six voltage applying lines 131a to 131f intersect the corresponding fan-out parts 120A, 120B, and 120C. In FIG. 4, connection points at which the six voltage applying lines 131a to 131f contact the voltage wirings are each represented by P1, P2, P3, P4, P5, and P6.

Due to an intersecting structure between the voltage applying lines 131b to 131e and the data fan-out parts 120A, 120B, and 120C, all distances d1, d2, d3, d4, and d5 between the six connection points can be substantially equal.

On the other hand, at least two of the distances d1, d2, d3, d4, and d5 between the six connection points can be different from each other. In this case, a maximum distance between the connection points can be about twice or less of a minimum distance between the connection points. For example, d2, d3, and d4 are substantially equal to each other and d1 and d5 are about twice or less than d2. When the maximum distance between the connection points exceeds about twice of the minimum distance between the connection points, a deviation in wiring resistance is increased.

Figure 5:
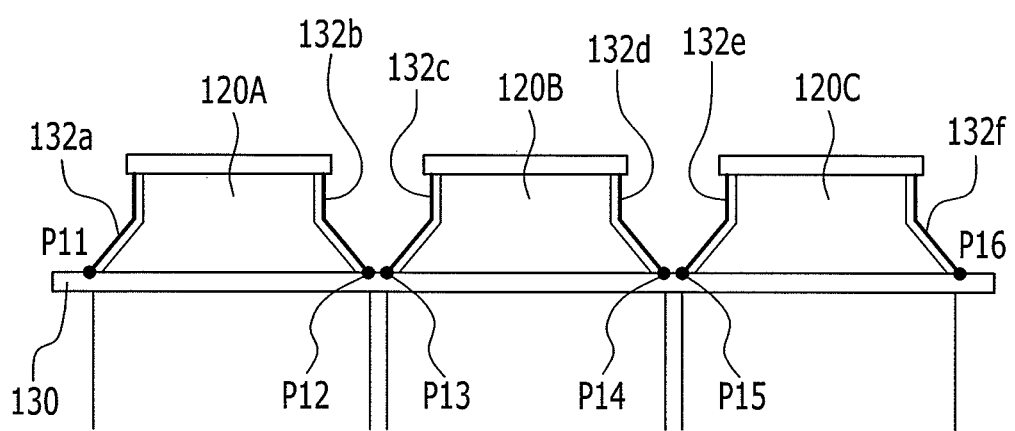
FIG. 5 is a schematic diagram illustrating an OLED display according to a first comparative example.

FIG. 5 is a schematic diagram illustrating an OLED display according to a first comparative example.

Referring to FIG. 5, in the OLED display according to a first comparative example, all six voltage applying lines 132a to 132f are formed substantially in parallel with the corresponding data fan-out parts 120A, 120B, and 120C. In this case, six connection points P11, P12, P13, P14, P15, and P16 at which the voltage applying lines 132a to 132f contact the voltage wirings 130 show a very large interval deviation.

In the case of the first comparative example, a deviation in wiring resistance between the driving voltage lines, which are close to the connection points among the driving voltage lines 132a to 132f which are connected to the voltage wirings 130, and the driving voltage lines, which are far away therefrom, greatly occurs. Therefore, the driving voltage lines which are far away from the connection points have a larger voltage drop than the driving voltage lines which are close to the connection points, such that uniformity (left and right uniformity) depending on a row direction of a screen deteriorates.

Referring again FIG. 4, the OLED display according to the first exemplary embodiment removes the interval deviation between the connection points for the voltage wiring 130 or greatly reduces the interval deviation therebetween due to the intersecting structure among the voltage applying lines 131b to 131e and the data fan-out parts 120A, 120B, and 120C. Therefore, it is possible to reduce the deviation in the wiring resistance between the driving voltage lines 103 at a close portion to the connection point and the driving voltage lines 103 at a far portion from the connection point, among the driving voltage lines 103 which are connected to the voltage wirings 130 and improve the uniformity depending on the row direction of the screen.

Figure 6A:
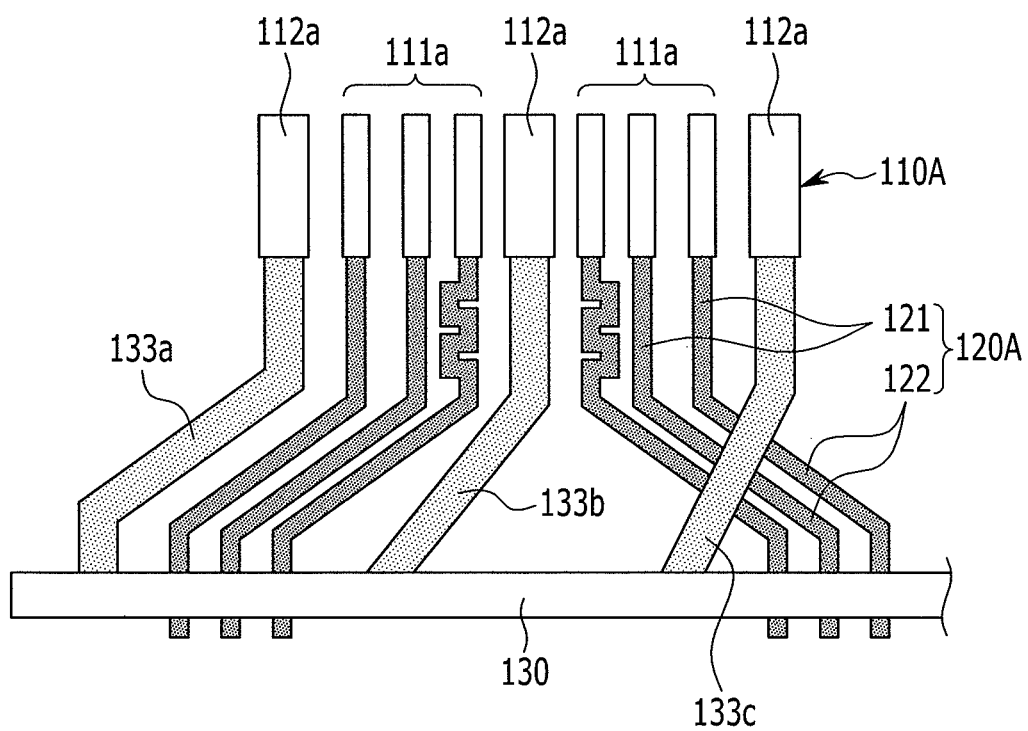
FIGS. 6A to 6C are partially enlarged views of an OLED display according to a second exemplary embodiment.
Figure 6B:
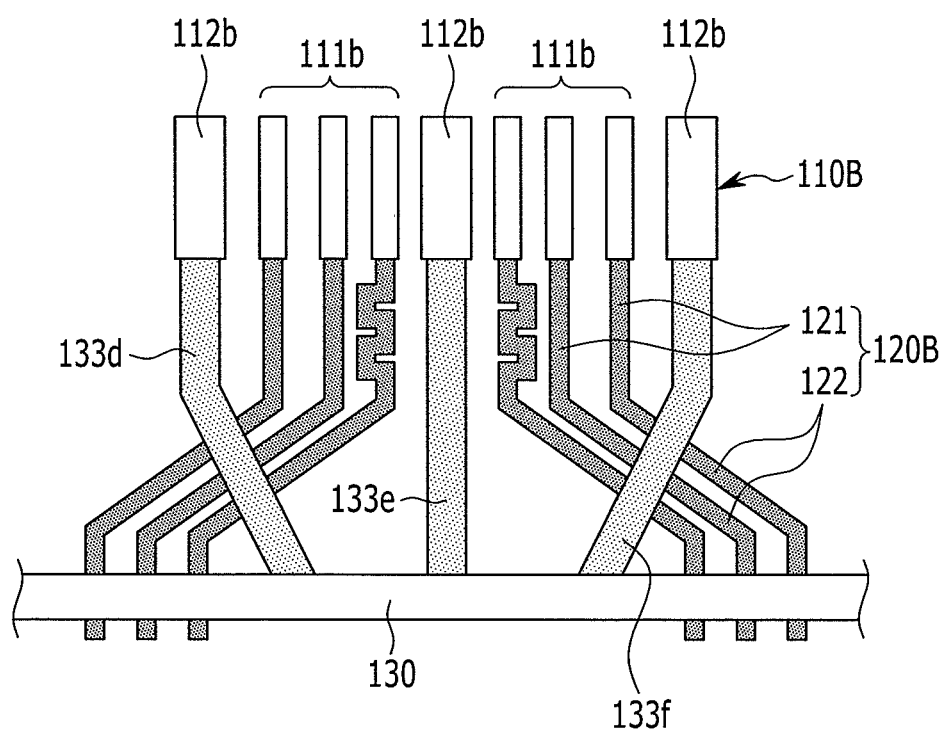
Figure 6C:
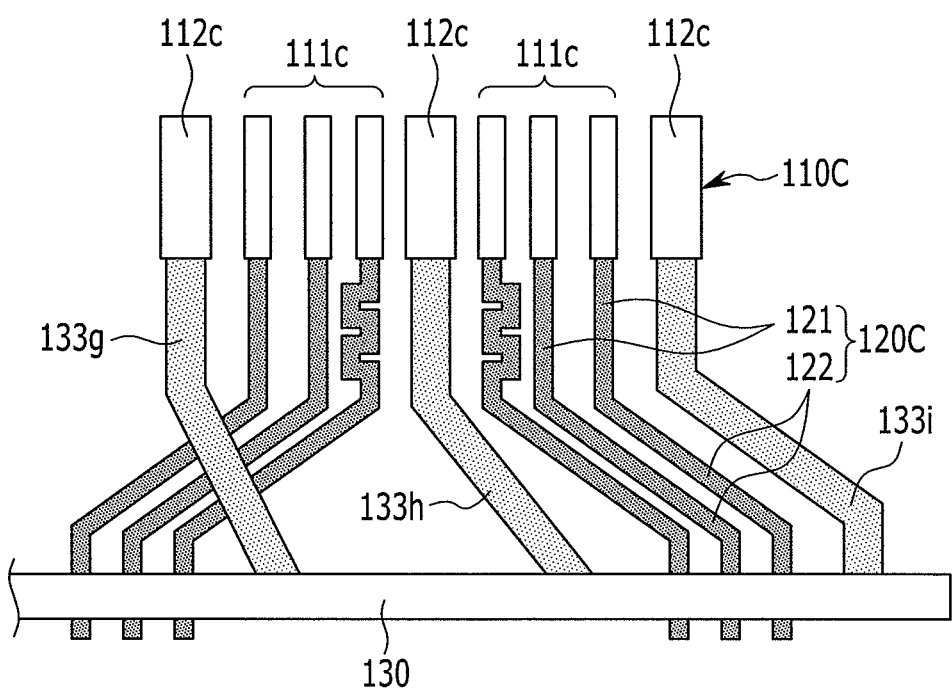
Figure 7:
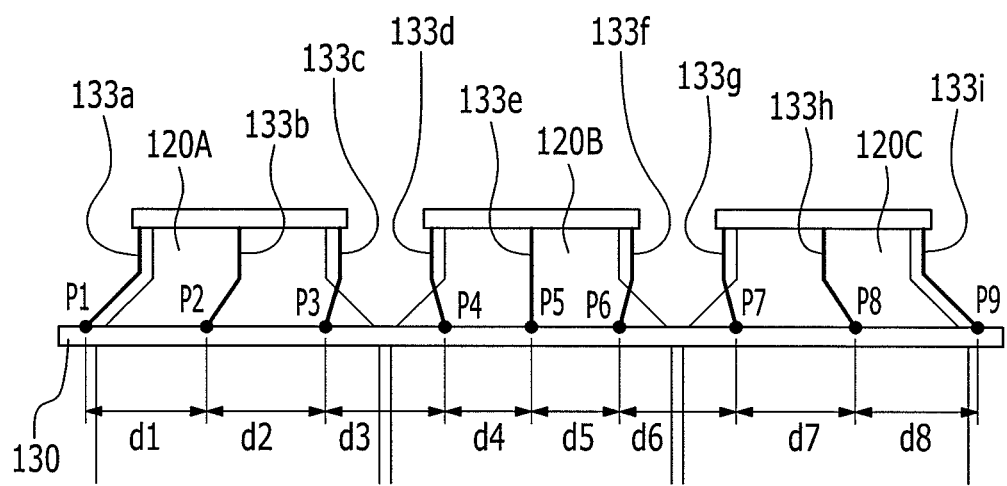
FIG. 7 is a schematic diagram illustrating some components of the OLED display according to the second exemplary embodiment.

FIGS. 6A to 6C are partially enlarged views of an OLED display according to a second exemplary embodiment. FIG. 7 is a schematic diagram illustrating some components of the OLED display according to the second exemplary embodiment.

The OLED display according to the second exemplary embodiment is configured to be similar to the first exemplary embodiment as described above except that the dummy pads which are positioned at the center with respect to each data pad part 110A, 110B, and 110C and the voltage applying lines connected to the dummy pads are added. The same members as the first exemplary embodiment are denoted by the same reference numeral.

Referring to FIG. 6A, the left data pad part 110A includes the data pads 111a and three dummy pads 112a which are positioned at the center and the outermost sides. Further, three voltage applying lines 133a, 133b, and 133c connect three dummy pads 112a to the voltage wiring 130. Any one of the three voltage applying lines 133a, 133b, and 133c can be formed substantially in parallel with the data fan-out part 120A and the rest two thereof can intersect the data fan-out part 120A.

For example, the voltage applying line 133a (left voltage applying line) which is far away from the central data pad part 110B is formed substantially in parallel with the data fan-out part 120A. On the other hand, the voltage applying line 133b, which is positioned at the center, and the voltage applying line 133c (right voltage applying line), which is close to the central data pad part 110B, intersect the data fan-out part 120A.

The two voltage applying lines 133b and 133c which intersect the data fan-out part 120A can be formed to have the same inclined angle or different inclined angles.

Referring to FIG. 6B, the central data pad part 110B includes the data pads 111b and three dummy pads 112b which are positioned at the center and the outermost sides. Further, three voltage applying lines 133d, 133e, and 133f connect three dummy pads 112b to the voltage wiring 130. Any one of the three voltage applying lines 133d, 133e, and 133f can be formed substantially in parallel with the data fan-out part 120B and the rest two thereof can intersect the data fan-out part 120B.

For example, the voltage applying line 133e which is positioned at the center is formed substantially in parallel with the data fan-out part 120B. On the other hand, the two voltage applying lines 133d and 133f which are positioned outside intersect the data fan-out part 120B. The voltage applying line 133e which is positioned at the center can be formed in a substantially vertical line and the two voltage applying lines 133d and 133f which are positioned outside can be formed substantially in bilateral symmetry.

Referring to FIG. 6C, the right data pad part 110C includes the data pads 111c and three dummy pads 112c which are positioned at the center and the outermost sides. Further, three voltage applying lines 133g, 133h, and 133i connect three dummy pads 112c to the voltage wiring 130. Any one of the three voltage applying lines 133g, 133h, and 133i can be formed substantially in parallel with the data fan-out part 120C and the rest two thereof can intersect the data fan-out part 120C.

For example, the voltage applying line 133i (right voltage applying line), which is far away from the central data pad part 110B, is formed in parallel with the data fan-out part 120C. On the other hand, the voltage applying line 133h, which is positioned at the center, and the voltage applying line 133g (left voltage applying line), which is close to the central data pad part 110B, intersect the data fan-out part 120C.

The two voltage applying lines 133g and 133h which intersect the data fan-out part 120C can be formed to have the same inclined angle or different inclined angles.

Referring to FIG. 7, six voltage applying lines 133b, 133c, 133d, 133f, 133g, and 133h other than the three voltage applying lines 133a, 133e, and 133i, which are positioned at the outermost sides and the center, among nine voltage applying lines 133a to 133i intersect the corresponding data fan-out parts 120A, 120B, and 120C. In FIG. 7, connection points at which the nine voltage applying lines 133a to 133i contact the voltage wirings 130 are each represented by P1, P2, P3, P4, P5, P6, P7, P8, and P9.

All distances among nine connection points d1, d2, d3, d4, d5, d6, d7, and d8 can be substantially equal. On the other hand, the distance between the nine connection points can be different from each other. In this case, the maximum distance between the connection points can be approximately twice as great as the minimum distance between the connection points.

As compared with the first exemplary embodiment as described above, the OLED display according to the second exemplary embodiment increases the number of voltage applying lines 133a to 133i and reduces the distance between the connection points. Therefore, as compared with the first exemplary embodiment as described above, the OLED display according to the second exemplary embodiment reduces the deviation in wiring resistance between the driving voltage lines and increases the uniformity depending on the row direction of the screen.

Figure 8:
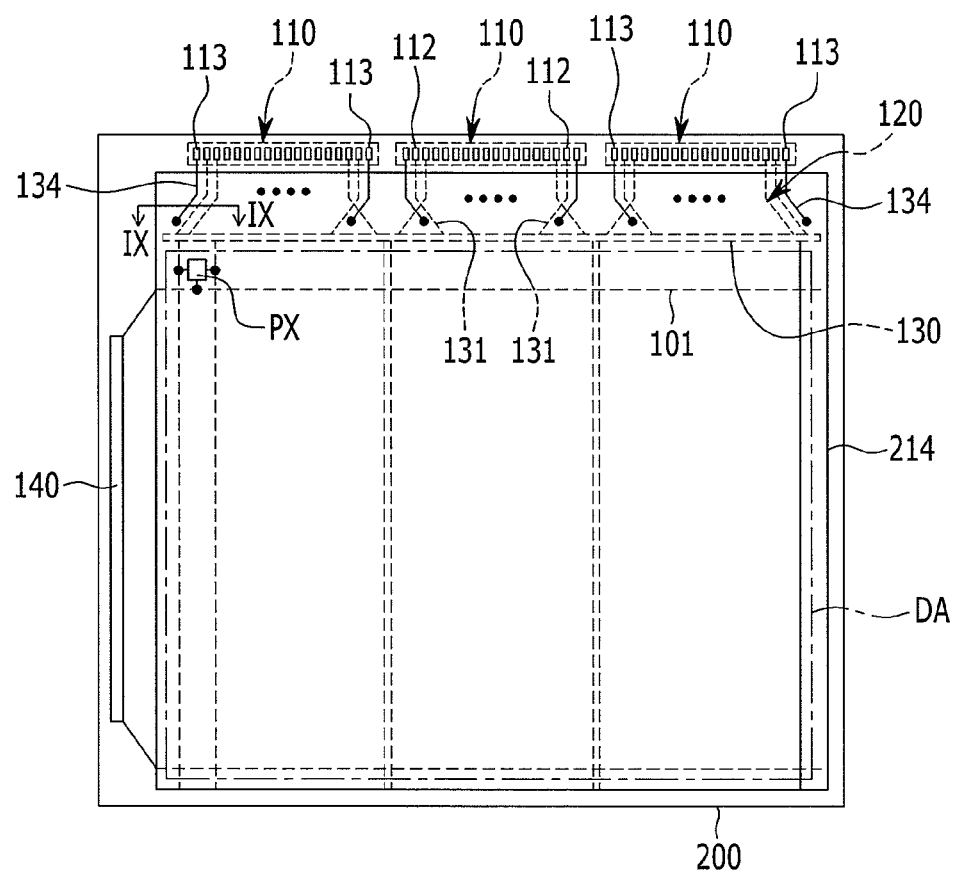
FIG. 8 is a schematic diagram of an OLED display according to a third exemplary embodiment.
Figure 9:
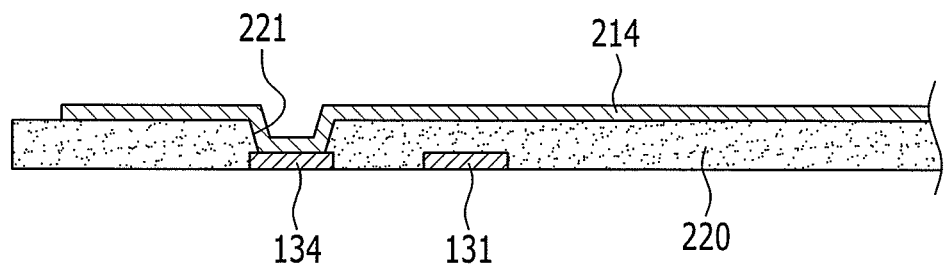
FIG. 9 is a partial cross-sectional view taken along the line IX-IX of FIG. 8.

FIG. 8 is a schematic diagram of an OLED display according to a third exemplary embodiment. FIG. 9 is a partial cross-sectional view taken along the line IX-IX of FIG. 8.

Referring to FIGS. 8 and 9, the OLED display according to the third exemplary embodiment further includes an additional dummy pad 113 (second dummy pad) and an additional voltage applying line 134 (second voltage applying line) for applying the common voltage ELVSS to a common electrode 214, in addition to the components of the first exemplary embodiment. For convenience, the dummy pad 112 and the voltage applying line 131 according to the first exemplary embodiment are each called a first dummy pad and a first voltage applying line.

The common electrode 214 is formed to be larger than the display area (DA) and covers the data fan-out part 120. An insulating layer 220 is formed between the data fan-out part 120 and the common electrode 214 to insulate therebetween. The second dummy pad 113 is positioned outside the first dummy pad 112 and the second voltage applying line 134 is formed substantially in parallel with the first voltage applying line 131 outside of the first voltage applying line 131.

The second voltage applying line 134 is spaced apart from the voltage wiring 130 at a predetermined distance. A via hole 221 is formed at an end of the second voltage applying line 134 at a middle of the insulating layer 220 and the common electrode 214 is connected to the end of the second voltage applying line 134 through the via hole 221 to be applied with the common voltage ELVSS from the second voltage applying line 134.

Figure 10A:
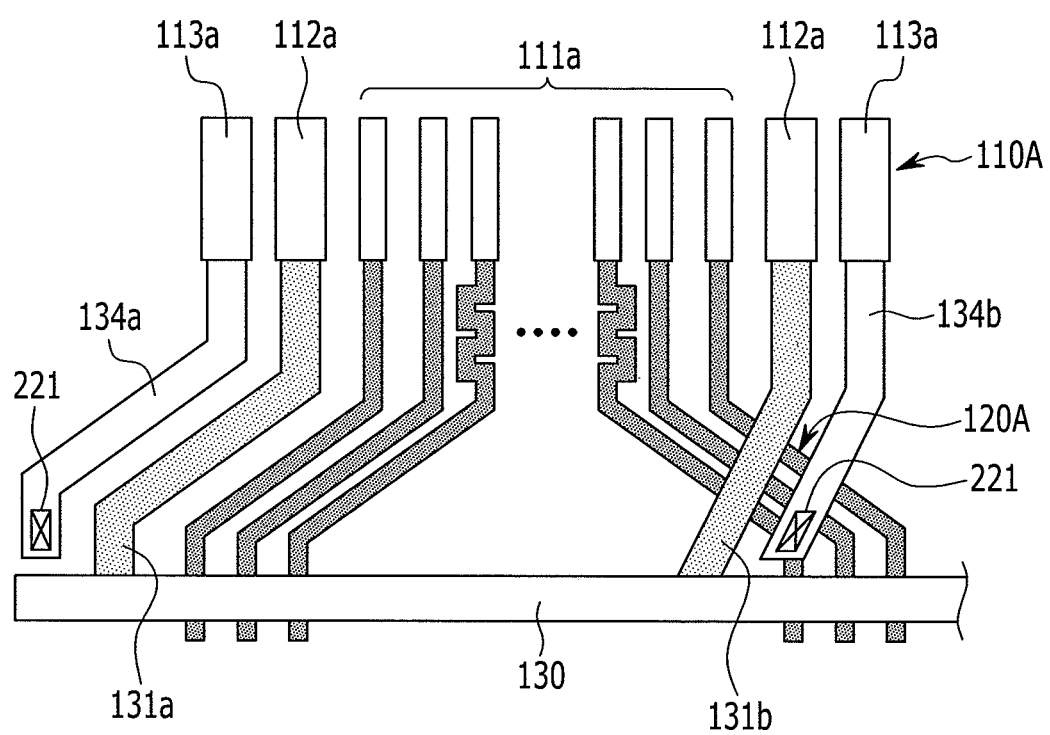
FIGS. 10A to 10C are partially enlarged views of the OLED display illustrated in FIG. 8.
Figure 10B:
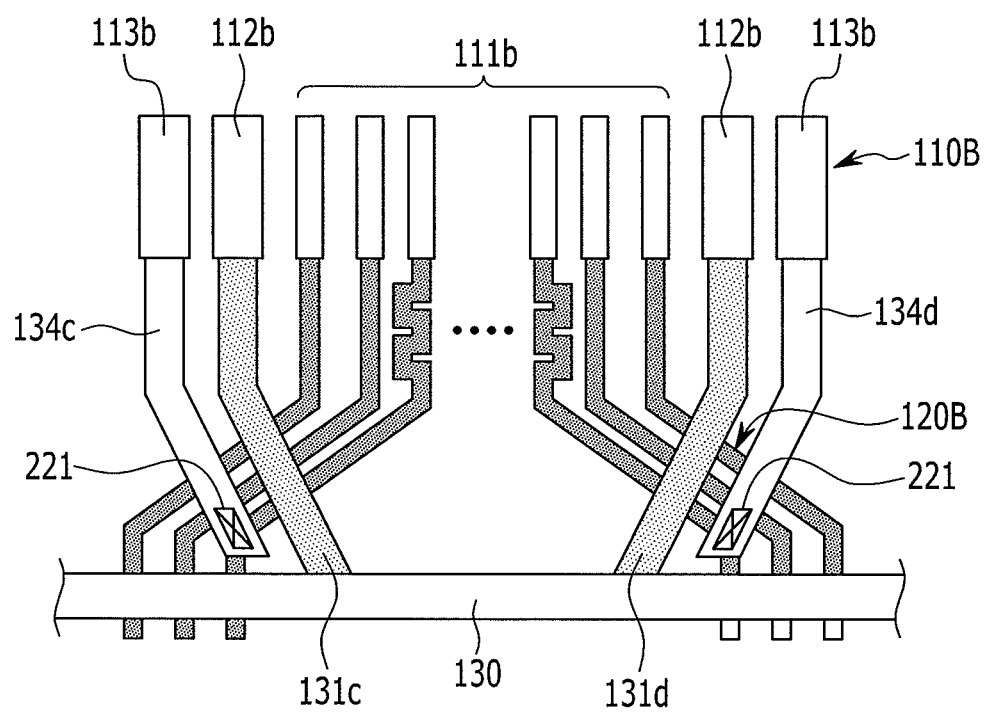
Figure 10C:
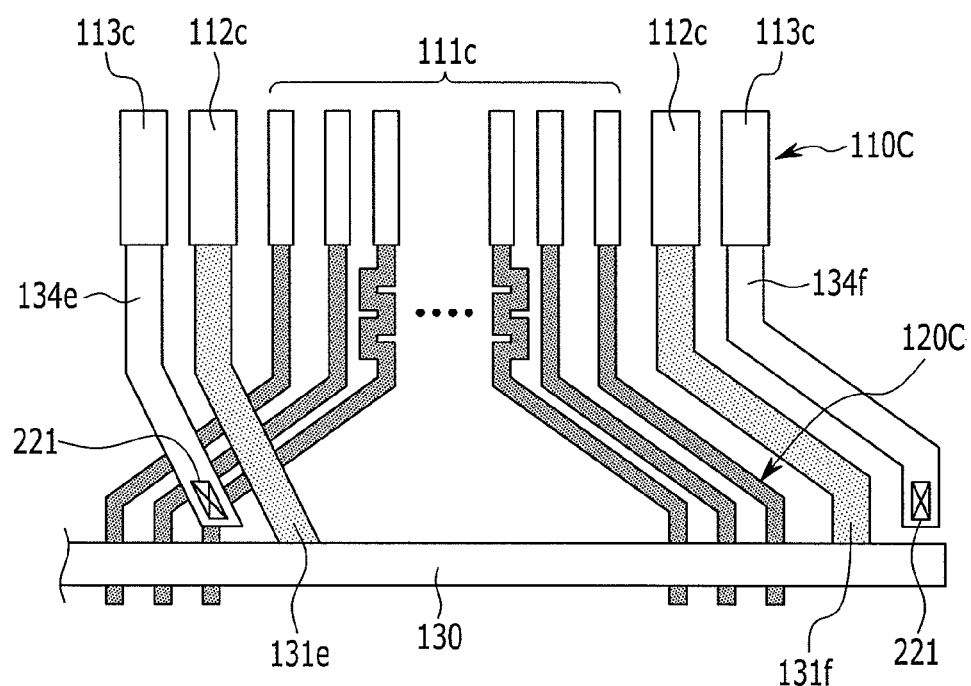

FIGS. 10A to 10C are partially enlarged views of the OLED display illustrated in FIG. 8. The left data pad part, the central data pad part, and the right data pad part among three data pad parts illustrated in FIG. 8 are each illustrated in FIGS. 10A to 10C.

Referring to FIG. 10A, the left data pad part 110A includes the data pads 111a which are positioned at the center, the two first dummy pads 112a which are positioned outside the data pad 111a, and the two second dummy pads 113a which are positioned outside the first dummy pad 112a.

Two second voltage applying lines 134a and 134b are connected to the two second dummy pads 113a and ends of the second voltage applying lines 134a and 134b are provided with the via hole 221 of the insulating layer. The left second voltage applying lines 134a of the two second voltage applying lines 134a and 134b can be formed substantially in parallel with the data fan-out part 120A and the right second voltage applying line 134b can intersect the data fan-out part 120A.

Referring to FIG. 10B, the central data pad part 110B includes the data pads 111b which are positioned at the center, the two first dummy pads 112b which are positioned outside the data pad 111b, and the two second dummy pads 113b which are positioned outside the first dummy pad 112b.

Two second voltage applying lines 134c and 134d are connected to the two second dummy pads 113b, and ends of the second voltage applying lines 134c and 134d are provided with the via hole 221 of the insulating layer. The two second voltage applying lines 134c and 134d both can intersect the data fan-out part 120B.

Referring to FIG. 10C, the right data pad part 110C includes the data pads 111c which are positioned at the center, the two first dummy pads 112c which are positioned outside the data pad 111c, and the two second dummy pads 113c which are positioned outside the first dummy pad 112c.

Two second voltage applying lines 134e and 134f are connected to the two second dummy pads 113c, and ends of the second voltage applying lines 134e and 134f are provided with the via hole 221 of the insulating layer. The right second voltage applying line 134f of the two second voltage applying lines 134e and 134f can be formed substantially in parallel with the data fan-out part 120C, and the left second voltage applying line 134e can intersect the data fan-out part 120C.

Figure 11:
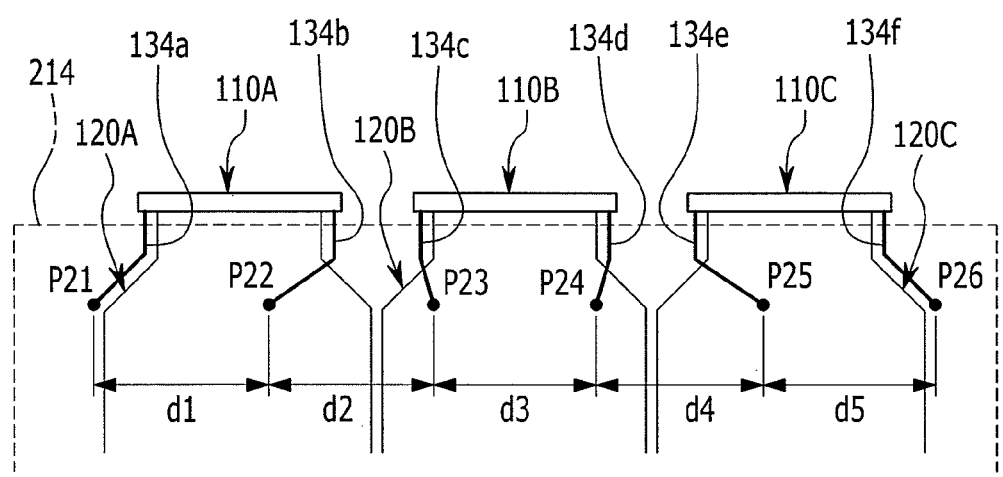
FIG. 11 is a schematic diagram illustrating some components of the OLED display illustrated in FIG. 8.

FIG. 11 is a schematic diagram illustrating some components of the OLED display illustrated in FIG. 8.

Referring to FIG. 11, the four second voltage applying lines 134b, 134c, 134d, and 134e other than the two second voltage applying lines 134a and 134f, which are positioned at an outermost side, among the six second voltage applying lines 134a, 134b, 134c, 134d, 134e, and 134f intersect the corresponding fan-out parts 120A, 120B, and 120C. In FIG. 11, the connection points at which the six second voltage applying lines 134a, 134b, 134c, 134d, 134e, and 134f contact the common electrode 214 through the via hole of the insulating layer are each represented by P21, P22, P23, P24, P25, and P26.

Due to the intersecting structure between the second voltage applying lines 134a, 134b, 134c, 134d, 134e, and 134f and the data fan-out parts 120A, 120B, and 120C, all distances d1, d2, d3, d4, and d5 between the six connection points can be substantially equal. On the other hand, at least two of the distances between the six connection points can be different from each other. In this case, a maximum distance between the connection points can be about twice or less of a minimum distance between the connection points.

The OLED display according to the third exemplary embodiment removes the interval deviation between the connection points at which the common voltage ELVSS is applied to the common electrode 214 or greatly reduces the interval deviation therebetween, thereby increasing the uniformity of the screen.

According to at least one of the disclosed embodiments, the data fan-out part 120 is formed of the same material as a gate electrode of a thin film transistor and the voltage wiring 130, the voltage applying line 131 (first voltage applying line). The second voltage applying line 132 can be formed of the same material as a source/drain electrode of the thin film transistor.

Figure 12:
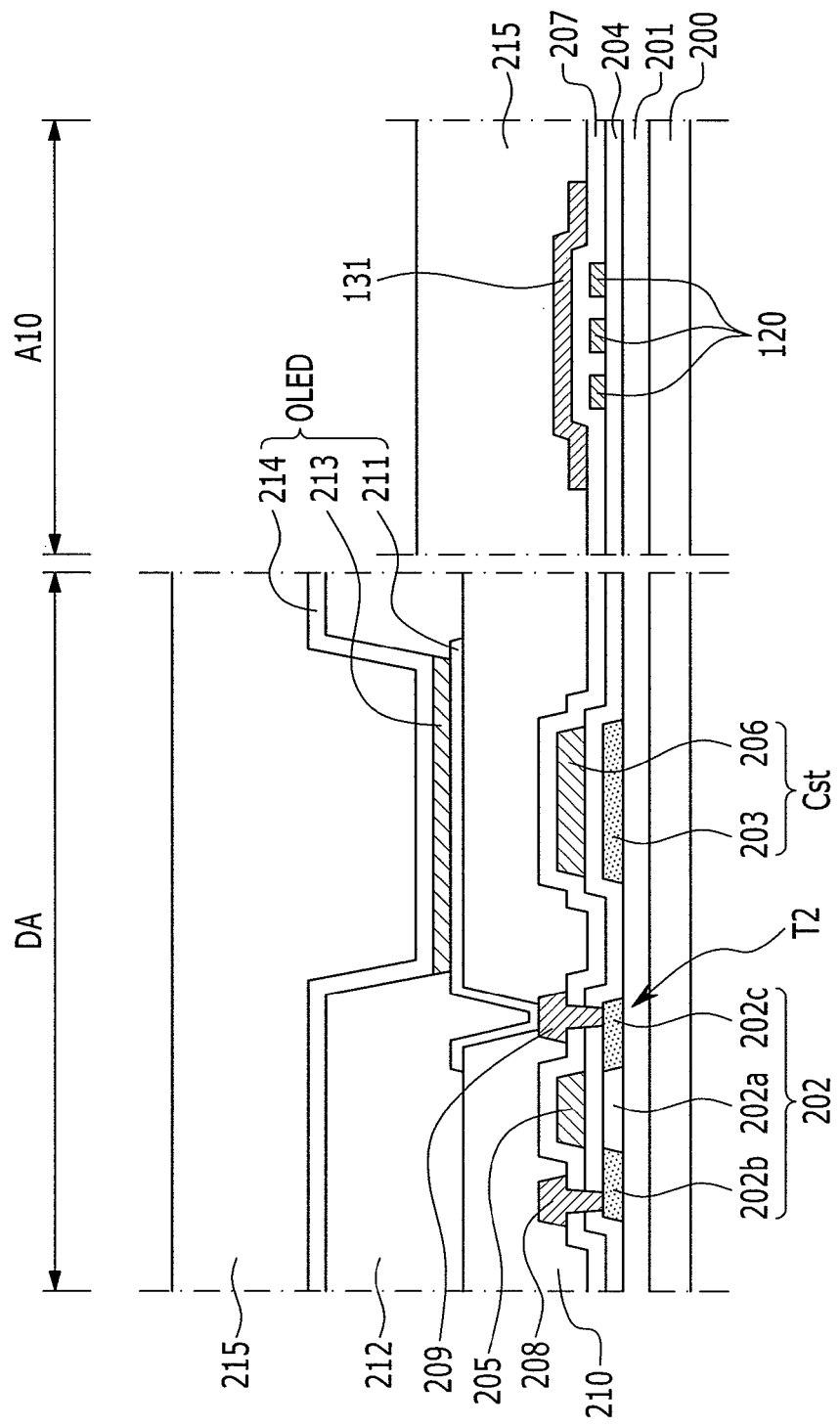
FIG. 12 is an enlarged cross-sectional view of the OLED display illustrated in FIG. 1.

FIG. 12 is an enlarged cross-sectional view of the OLED display illustrated in FIG. 1. For convenience, a switching thin film transistor is omitted in the display area (DA) and a first region A10 of FIG. 12 illustrates a section taken along the line XII-XII of FIG. 3B.

Referring to FIGS. 1 and 12, a buffer layer 201 is formed on the substrate 200. The substrate 200 can be an insulating substrate which is formed of insulating materials such as glass, quartz, ceramic, and plastic and can be a metal substrate which is formed of stainless steel, and the like. The buffer layer 201 can have a single layer which is formed of silicon nitride (SiNx) or a double layer which is formed of silicon nitride (SiNx) and silicon oxide (SiO2). The buffer layer 201 serves to planarize a surface while preventing a permeation of impurity through the substrate 200.

A semiconductor layer 202 and a first storage condenser plate 203 are formed on the buffer layer 201. The semiconductor layer 202 can be formed of polysilicon or oxide semiconductor. When the semiconductor layer 202 is formed of oxide semiconductor, the semiconductor layer 200 can be covered with a separate passivation layer. The semiconductor layer 202 includes a channel region 202a which is not doped with impurities and a source region 202b and a drain region 202c which are doped with impurity.

A gate insulating layer 204 is formed on the semiconductor layer 202 and the first storage condenser plate 203. The gate insulating layer 204 can be formed of a single layer of silicon nitride or silicon oxide or a stacked layer thereof. A gate electrode 205 and a second storage condenser plate 206 are formed on the gate insulating layer 204. The gate electrode 205 overlaps a channel region 202a of the semiconductor layer 202 and can be formed of Au, Ag, Cu, Ni, Pt, Pd, Al, Mo, and the like.

The second storage condenser plate 206 overlaps the first storage condenser plate 203. Therefore, the first and second storage condenser plates 203 and 206 form the storage capacitor Cst using a gate insulating layer 204 as a dielectric material.

An interlayer insulating layer 207 is formed on the gate electrode 205 and the second storage condenser plate 206. Similar to the gate insulating layer 204, the interlayer insulating layer 207 can be formed of a single layer which is formed of silicon nitride or silicon oxide or a stacked layer thereof. A source electrode 208 and a drain electrode 209 are formed on the interlayer insulating layer 207. The source electrode 208 and the drain electrode 209 are each connected to the source region 202b and the drain region 202c of the semiconductor layer 202 through the via holes which are formed on the interlayer insulating layer 207 and the gate insulating layer 204. The source electrode 208 and the drain electrode 209 can be formed of a multi-layered metal layer such as Mo/Al/Mo and Ti/Al/Ti.

FIG. 12 illustrates, for example, the driving thin film transistor T2 of a top gate type, but the structure of the driving thin film transistor T2 is not limited to the illustrated example. The driving thin film transistor T2 is protected by being covered with a planarization layer 210 and is electrically connected to the OLED to drive the OLED.

The planarization layer 210 can be formed of a single layer of an inorganic insulator or an organic insulator or a stacked layer thereof. The inorganic insulator can be formed of SiO2, SiNx, Al2O3, TiO2, ZrO2, and the like and the organic insulator can be formed of acryl-based polymer, imide-based polymer, polystyrene (PS), and the like.

A pixel electrode 211 is formed on the planarization layer 210. The pixel electrode 211 is connected to the drain electrode 209 of the driving thin film transistor T2 via the via hole which is formed in the planarization layer 210. A pixel defined layer 212 is formed on the planarization layer 210 and an edge of the pixel electrode 211. The pixel defined layer 212 can be formed of polyacryl-based or polyimide-based resin, silica-based inorganic materials, and the like.

An organic emission layer 213 is formed on the pixel electrode 211. The organic emission layer 213 includes an emission layer and includes at least one of a hole injection layer, a hole transportation layer, an electron transportation layer, and an electron injection layer.

The common electrode 214 is formed on the organic emission layer 213 and the pixel defined layer 212. The common electrode 214 is formed in the whole display area (DA) without being differentiated for each pixel. When the OLED display is a top emission type, the pixel electrode 211 is formed of a reflecting layer and the common electrode 214 is formed of a transparent layer or a translucent layer.

The reflecting layer can be formed of Au, Ag, Mg, Al, Pt, Pd, Ni, Nd, Ir, Cr, and the like. The transparent layer can be formed of indium tin oxide (ITO), indium zinc oxide (IZO), ZnO, In2O3, and the like. The translucent layer can be formed of a metal thin film including Li, Ca, LiF/Ca, LiF/Al, Al, Ag, Mg, and the like and the transparent layer of ITO, IZO, ZnO, In2O3, and the like can be formed on the translucent layer.

Light emitted from the organic emission layer 213 is reflected from the pixel electrode 211 and transmits the common electrode 214 to be emitted to the outside. On the other hand, when the OLED display is a bottom emission type, the pixel electrode 211 is formed of the transparent layer or the translucent layer and the common electrode 214 is formed of the reflecting layer. In this case, light emitted from the organic emission layer 213 is reflected from the common electrode 214 and transmits the pixel electrode 211 and the substrate 200 to be emitted to the outside.

A thin film encapsulation layer 215 is formed on the common electrode 214 or the encapsulation substrate can be bonded to an edge of the substrate 200. FIG. 12 illustrates, for example, a case in which the thin film encapsulation layer 215 is formed. The thin film encapsulation layer 215 has a structure in which at least one inorganic layer and at least one organic layer are stacked and serves to encapsulate the OLED from external air.

In the first region A10, the data fan-out part 120 can be formed of the same material as the gate electrode 205. The data line 102 which is not illustrated in FIG. 12 can also be formed of the same material as the gate electrode 205. The voltage applying line 131 can be formed of the same material as the source and drain electrodes 208 and 209 of the driving thin film transistor T2. The voltage wiring 130, the scan line 101, and the driving voltage line 103 which are not illustrated in FIG. 12 can also be formed of the same material as the source and drain electrodes 208 and 209.

The data fan-out unit 120 and the voltage applying line 131 are insulated from each other by interlayer insulating layer 207, and the voltage applying line 131 intersects the diagonal part 122 of the data fan-out part 120.

Figure 13A:
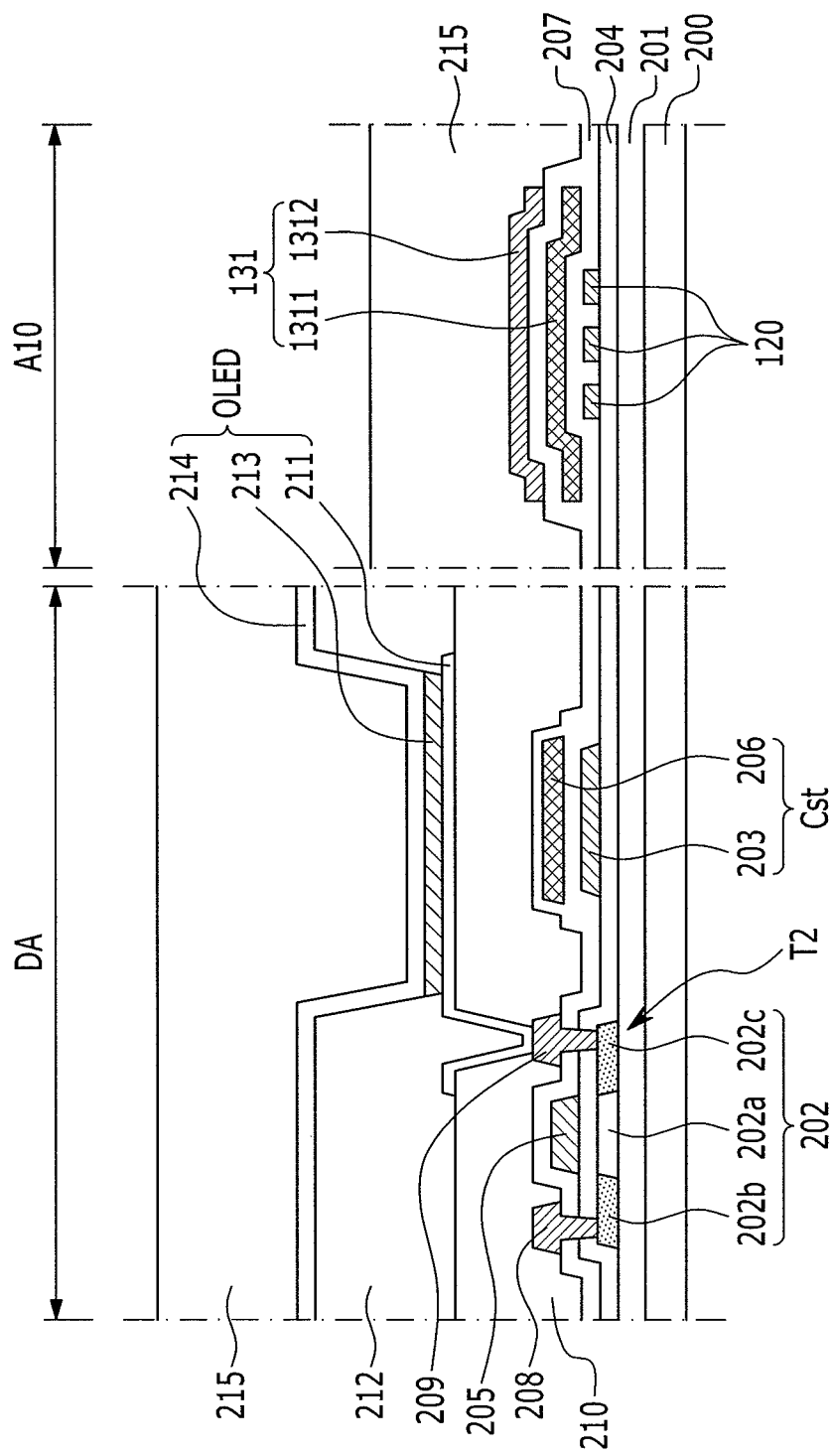
FIGS. 13A and 13B are enlarged cross-sectional views of the OLED display according to a fourth exemplary embodiment.
Figure 13B:
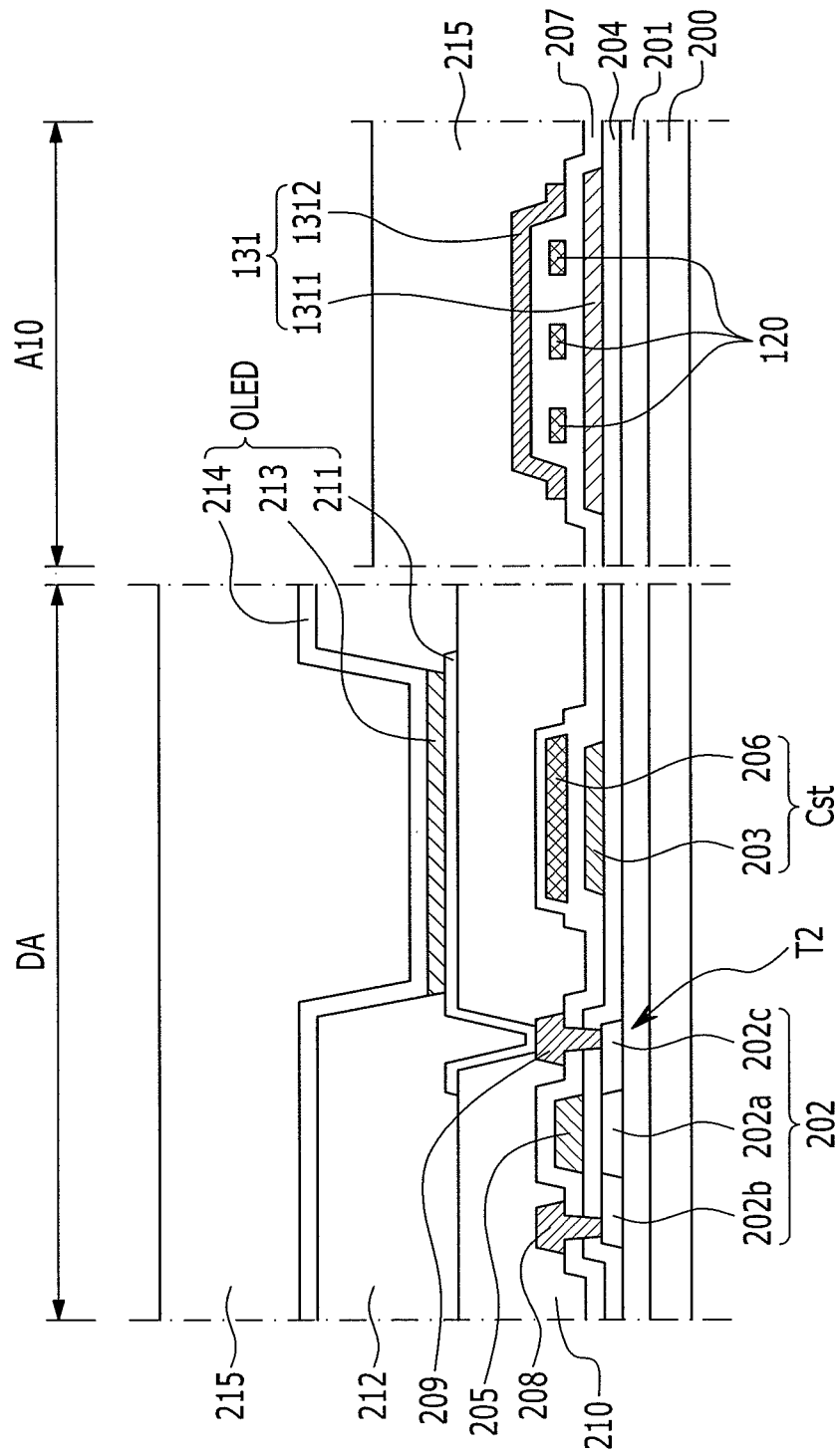

FIGS. 13A and 13B are enlarged cross-sectional views of the OLED display according to a fourth exemplary embodiment.

Referring to FIGS. 13A and 13B, the storage capacitor Cst of the display area (DA) includes the first storage condenser plate 203 and the second storage condenser plate 206 which use the interlayer insulating layer 207 as the dielectric material. The first and second storage condenser plates 203 and 206 both can be covered with the interlayer insulating layer 207.

The first storage condenser plate 203 can be formed of the same material as the gate electrode 205 of the driving thin film transistor T2 and the second storage condenser plate 206 can be formed of the same or different conductive material as or from the first storage condenser plate 203. The configuration of the display area DA other than the storage capacitor Cst is the same as that of the foregoing first exemplary embodiment.

Referring to FIG. 13A, in the first region A10, the data fan-out part 120 can be formed of the same material as the gate electrode 205 and the first storage condenser plate 203. The voltage applying line 131 can include a first layer 1311 which is formed of the same material as the second storage condenser plate 206 and a second layer 1312 which is formed of the same material as the source and drain electrodes 208 and 209. The first layer 1311 and the second layer 1312 can be separated from each other by the interlayer insulating layer 207.

Referring to FIG. 13B, in the first region A10, the data fan-out part 120 can be formed of the same material as the second storage condenser plate 206. The voltage applying line 131 can include a first layer 1311 which is formed of the same material as the gate electrode 205 and the first storage condenser plate 203 and a second layer 1312 which is formed of the same material as the source and drain electrodes 208 and 209. The data fan-out part 120 is positioned between the first layer 1311 and the second layer 1312. The first layer 1311, the second layer 1312 and the data fan-out part 120 are separated from each other by interlayer insulating layer 207.

Figure 14:
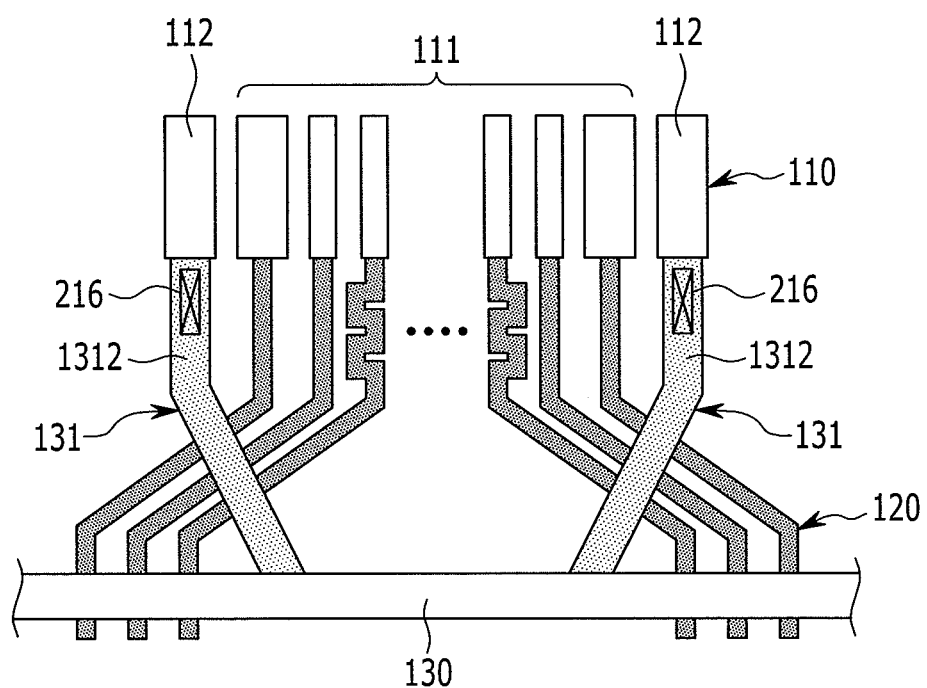
FIG. 14 is a partially enlarged view of an OLED display according to the fourth exemplary embodiment.

In FIGS. 13A and 13B, the first layer 1311 and the second layer 1312 configuring the voltage applying line 131 are connected to each other through the via hole. FIG. 14 is a partially enlarged view of an OLED display according to the fourth exemplary embodiment.

Referring to FIGS. 13A and 13B and FIG. 14, the first layer 1311 and the second layer 1312 are connected to each other through a via hole 216 which is formed on the interlayer insulating layer 207. The via hole 216 can be formed at ends of the first layer 1311 and the second layer 1312 which are close to the dummy pad 112 so as not to overlap the data fan-out part 120. The voltage wiring 130 which is not illustrated in FIGS. 13A and 13B can be formed of the same material as the source and drain electrodes 208 and 209.

Figure 15:
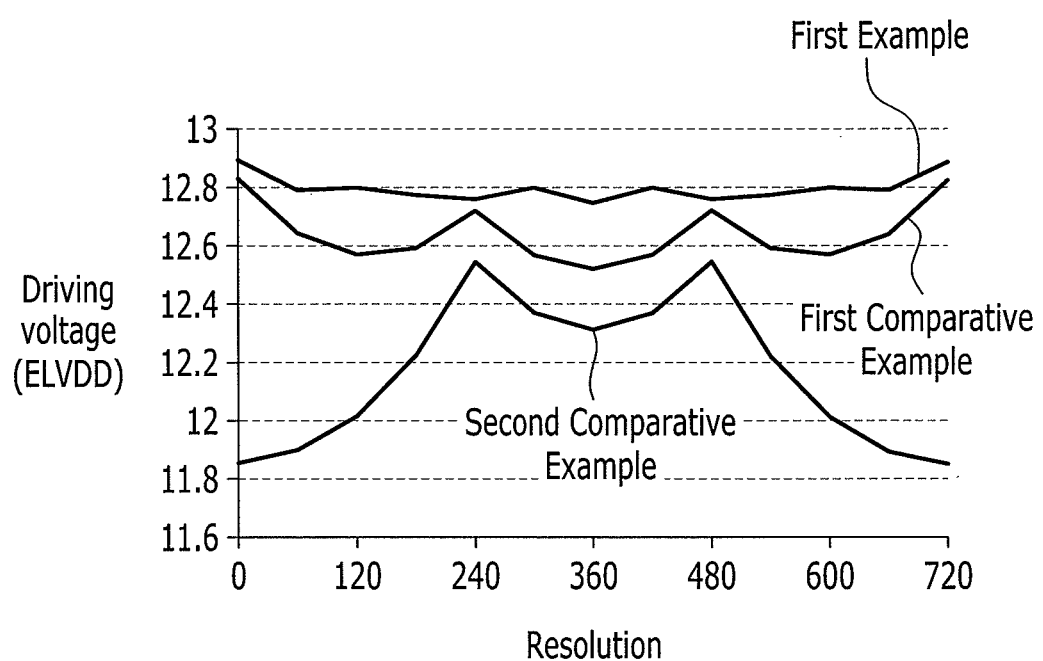
FIG. 15 is a graph illustrating a driving voltage (ELVDD) measured in the OLED display according to a first example, the first comparative example, and a second comparative example.

FIG. 15 is a graph illustrating a driving voltage (ELVDD) measured in the OLED display according to a first example, the first comparative example, and a second comparative example. A horizontal axis of the graph represents row direction resolution and a vertical axis thereof represents the driving voltage (ELVDD) which is measured in a first pixel row of the display area.

FIG. 5 illustrates a configuration of the first comparative example. The second comparative example has the same configuration as the first comparative example except that the two voltage applying lines 131a and 131f, which are positioned at the outermost side, among the six voltage applying lines illustrated in FIG. 5 are omitted. That is, the second comparative example includes four voltage applying lines 132b, 132c, 132d, and 132e.

Referring to FIG. 15, the first and second comparative examples show a large deviation in driving voltage (ELVDD) of pixels along the row direction but the first example shows a very small deviation in driving voltage (ELVDD) of pixels along the row direction. In the case of the first and second comparative examples 1 and 2, the deviation of the driving voltage (ELVDD) leads to the reduction in uniformity along the row direction but in the case of the first example, the reduction in uniformity along the row direction does not occur.

While the inventive technology has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light-emitting diode (OLED) display, comprising:
a plurality of data lines formed in a display area;
a plurality of data pad portions formed in a non-display area, each of the data pad portions including i) a plurality of data pads aligned in a row and ii) a plurality of voltage-applying pads formed on both ends of the row of data pads of each data pad portion;
a plurality of data fan-out portions electrically connected to the data pads and the data lines, and including a plurality of diagonal portions diagonally formed with respect to the data lines; and
a plurality of voltage applying lines electrically connected to the voltage-applying pads and insulated from the data fan-out portions, wherein at least one of the voltage applying lines intersects one or more of the diagonal portions.

2. The OLED display of claim 1, further comprising:
a plurality of driving voltage lines formed in the display area; and
a plurality of voltage wirings electrically connected to the voltage applying lines and the driving voltage lines and crossing the data fan-out portions such that the voltage wirings are insulated from the data fan-out portions.

3. The OLED display of claim 2, wherein the voltage applying lines, excluding two outermost voltage applying lines, intersect one or more of the diagonal portions.

4. The OLED display of claim 3, wherein the voltage wirings include a plurality of connection points contacting the voltage applying lines, and wherein all distances between neighboring connection points are substantially equal.

5. The OLED display of claim 3, wherein the voltage wirings include a plurality of connection points contacting the voltage applying lines, wherein at least two of the distances between neighboring connection points are different from each other, and wherein the maximum distance between any of the neighboring connection points is less than or equal to twice as long as the minimum distance between any of the other neighboring connection points.

6. The OLED display of claim 2, wherein the voltage-applying pads are formed outside of the data pads and position at a substantially center of the data pads, and wherein the voltage applying lines are electrically connected to each of the voltage-applying pads, respectively.

7. The OLED display of claim 6, wherein the voltage applying lines, excluding two outermost voltage applying lines and one voltage applying line positioned at a center, intersect one or more of the diagonal portions.

8. The OLED display of claim 7, wherein the voltage wirings include a plurality of connection points contacting the voltage applying lines, and wherein all distances between neighboring connection points are substantially equal.

9. The OLED display of claim 7, wherein the voltage wirings include a plurality of connection points contacting the voltage applying lines, wherein at least two of the distances between neighboring connection points are different from each other, and wherein the maximum distance between any of the neighboring connection points is less than or equal to about twice as long as the minimum distance between any of the other neighboring connection points.

10. The OLED display of claim 1, further comprising a common electrode formed in the display area, wherein the voltage applying lines are electrically connected to the common electrode.

11. The OLED display of claim 10, wherein the voltage applying lines are formed over a first insulating layer at least partially covering the data fan-out portions, wherein the common electrode is formed over a second insulating layer at least partially covering the voltage applying lines, and wherein the second insulating layer has via holes formed therein at each end of the voltage applying lines.

12. The OLED display of claim 11, wherein the voltage applying lines, excluding two outermost voltage applying lines, intersect one or more of the diagonal portions.

13. The OLED display of claim 12, wherein the common electrode includes a plurality of connection points contacting the voltage applying lines, and wherein all distances between neighboring connection points are substantially equal.

14. The OLED display of claim 12, wherein the common electrode includes a plurality of connection points contacting the voltage applying lines, wherein at least two of the distances between neighboring connection points are different from each other, and wherein the maximum distance between any of the neighboring connection points is less than or equal to about twice as long as the minimum distance between the any of the other neighboring connection points.

15. An organic light-emitting diode (OLED) display, comprising:
a plurality of data lines formed in a display area;
a plurality of voltage wirings formed in a non-display area;
a plurality of data pad portions formed in the non-display area, each of the data pad portions including i) a plurality of data pads extending in a first direction and including leftmost and rightmost data pads respectively located in the leftmost and rightmost regions of the data pad portions and ii) a plurality of voltage-applying pads placed in the left of the leftmost data pad and the right of the rightmost data pad of each data pad portion;
a plurality of data fan-out portions electrically connected to the data pads and the data lines, and including a plurality of first portions and a plurality of second portions formed slanted with respect to the first portions; and
a plurality of voltage applying lines electrically connected to the voltage-applying pads and insulated from the data fan-out portions, wherein at least one of the voltage applying lines intersects one or more of the second portions of the data fan-out portions.

16. The OLED display of claim 15, wherein the voltage applying lines, excluding two outermost voltage applying lines, intersect one or more of the second portions of the data fan-out portions.

17. The OLED display of claim 16, wherein the voltage wirings include a plurality of connection points contacting the voltage applying lines, and wherein all distances between neighboring connection points are substantially equal.

18. The OLED display of claim 16, wherein the voltage wirings include a plurality of connection points contacting the voltage applying lines, wherein at least two of the distances between neighboring connection points are different from each other, and wherein the maximum distance between any of the neighboring connection points is less than or equal to twice as long as the minimum distance between any of the other neighboring connection points.

19. The OLED display of claim 15, wherein the voltage-applying pads are formed outside of the data pads and positioned at a substantially center of the data pads, and wherein the voltage applying lines are electrically connected to each of the voltage-applying pads, respectively.

20. The OLED display of claim 19, wherein the voltage applying lines, excluding two outermost voltage applying lines and one voltage applying line positioned at a center, intersect one or more of the second portions of the data fan-out portions, wherein the voltage wirings include a plurality of connection points contacting the voltage applying lines, and wherein all distances between neighboring connection points are substantially equal.

* * * * *